(12) United States Patent
Summers

(10) Patent No.: US 10,523,254 B2
(45) Date of Patent: Dec. 31, 2019

(54) MIXER S11 CONTROL VIA SUM COMPONENT TERMINATION

(71) Applicant: QUALCOMM Incorporated, San Diego, CA (US)

(72) Inventor: Andrew Gordon Summers, Lawshall (GB)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/040,460

(22) Filed: Jul. 19, 2018

(65) Prior Publication Data

US 2019/0028124 A1 Jan. 24, 2019

Related U.S. Application Data

(60) Provisional application No. 62/535,150, filed on Jul. 20, 2017.

(51) Int. Cl.
*H04M 1/00* (2006.01)
*H04B 1/18* (2006.01)
*H04B 1/00* (2006.01)
*H04B 1/04* (2006.01)
*H04B 1/12* (2006.01)
*H03D 7/14* (2006.01)

(52) U.S. Cl.
CPC ........... *H04B 1/18* (2013.01); *H03D 7/14* (2013.01); *H03D 7/1483* (2013.01); *H04B 1/00* (2013.01); *H04B 1/0028* (2013.01); *H04B 1/04* (2013.01); *H04B 1/12* (2013.01)

(58) Field of Classification Search
CPC ...... H04B 1/006; H04B 1/0458; H04B 1/126; H03D 7/165; H04L 5/06; H04M 1/72519; H04M 1/72522
USPC ................................ 455/552.1, 550.1, 255
See application file for complete search history.

(56) References Cited

U.S. PATENT DOCUMENTS

| 5,745,276 | A | * | 4/1998 | Ho | H04B 10/6931 |
| | | | | | 250/214 A |
| 5,933,770 | A | * | 8/1999 | Heiter | H04B 1/109 |
| | | | | | 333/126 |
| 6,594,477 | B1 | * | 7/2003 | Kitaguchi | H03D 7/161 |
| | | | | | 334/1 |
| 6,941,106 | B1 | * | 9/2005 | Chen | H04B 1/005 |
| | | | | | 375/348 |
| 7,346,122 | B1 | * | 3/2008 | Cao | H03F 1/0211 |
| | | | | | 375/285 |

(Continued)

OTHER PUBLICATIONS

"Using the doublebalanced mixer DBM", Raynet Repair Services, Circuit Design, Jul. 9, 2017, Retrieved from internet on Jul. 20, 2017, https://www.raynetrepair.us/circuit-design/using-the-doublebalanced-mixer-dbm.html, pp. 1-17.

(Continued)

*Primary Examiner* — Danh C Le
(74) *Attorney, Agent, or Firm* — Seyfarth Shaw LLP

(57) ABSTRACT

A mixer termination circuit for a downconverter mixer includes a diplexer circuit coupled to an output of the downconverter mixer. The diplexer circuit is configured to separately terminate a sum component present in an output signal of the downconverter mixer and a difference component present in the output signal of the downconverter mixer.

14 Claims, 10 Drawing Sheets

(56) References Cited

U.S. PATENT DOCUMENTS

| | | | |
|---|---|---|---|
| 7,555,263 B1 * | 6/2009 | Rofougaran | H03B 21/01 327/113 |
| 7,627,303 B2 | 12/2009 | Stoll et al. | |
| 8,131,248 B2 | 3/2012 | Kumar | |
| 9,602,055 B1 | 3/2017 | Haridy et al. | |
| 2005/0037726 A1 * | 2/2005 | Vice | H03D 7/1441 455/326 |
| 2006/0003706 A1 * | 1/2006 | Welland | H04B 1/403 455/87 |
| 2006/0057983 A1 * | 3/2006 | Thompson | H03D 7/1441 455/127.3 |
| 2006/0073783 A1 * | 4/2006 | Tsai | H05K 7/2019 454/184 |
| 2008/0284525 A1 * | 11/2008 | Williams | H03L 7/087 331/11 |
| 2009/0304118 A1 * | 12/2009 | Yuanzhu | H04B 7/0854 375/340 |
| 2009/0323864 A1 * | 12/2009 | Tired | H03D 3/008 375/319 |
| 2010/0151811 A1 * | 6/2010 | Sheikh-Movahhed | H04B 7/082 455/326 |
| 2011/0050296 A1 * | 3/2011 | Fagg | H03B 27/00 327/118 |
| 2012/0081822 A1 * | 4/2012 | Woo | H01L 27/0251 361/56 |
| 2012/0293235 A1 * | 11/2012 | Nakamura | H04H 40/90 327/360 |
| 2013/0169341 A1 * | 7/2013 | Tanbakuchi | B82Y 35/00 327/355 |
| 2013/0169373 A1 * | 7/2013 | Rehman | H03B 5/1228 331/117 FE |
| 2015/0002146 A1 * | 1/2015 | Solomko | G01R 33/09 324/252 |
| 2016/0291056 A1 * | 10/2016 | Pickerd | G01R 13/225 |
| 2017/0155362 A1 * | 6/2017 | Selvanayagam | H03D 7/1441 |
| 2017/0201088 A1 * | 7/2017 | Huang | H02H 3/20 |
| 2017/0201288 A1 * | 7/2017 | Magers | H03C 3/40 |

OTHER PUBLICATIONS

Marki: "How to Measure Mixer IP3 and Identify Potential Error Sources", Mixers, Marki Microwave RF and Microwave Tech Notes, May 25, 2017, Retrieved from internet on Jul. 20, 2017, http://www.markimicrowave.com/blog/tag/mixers/, 14 Pages.

* cited by examiner

MIXER S11 CONTROL VIA SUM COMPONENT TERMINATION

CROSS-REFERENCE TO RELATED APPLICATION

This application claims the benefit of U.S. Provisional Patent Application No. 62/535,150, filed on Jul. 20, 2017, and entitled "MIXER S11 CONTROL VIA SUM COMPONENT TERMINATION," the disclosure of which is expressly incorporated by reference herein in its entirety.

BACKGROUND

Field

The present disclosure relates generally to wireless communication systems and, more specifically, to mixer radio frequency (RF) input port reflection coefficient (S11) control using sum component termination in a downconverter mixer of a receiver.

Background

A wireless device (e.g., a cellular phone or a smartphone) in a wireless communication system may include a radio frequency (RF) transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

The basic operation of a receiver in a wireless device including a mobile RF transceiver is as follows. In the receiver, a signal from the antenna is amplified in an RF stage. The output of the RF stage is one input of an RF mixer. A local oscillator (LO) is the other input of the RF mixer. The output of the mixer is an intermediate frequency (IF) signal. A second mixer stage may convert the IF signal to a baseband signal. The signal is then demodulated. The modulation technique is independent from the receiver technology.

An RF mixer is a three port electronic circuit that converts a signal from one frequency to another. The three signal connections (or ports) of the RF mixer include an RF input, a local oscillator (LO) input, and an intermediate frequency (IF) output. In operation, the RF mixer takes a radio frequency (RF) input signal and mixes the RF input signal with the local oscillator input. Mixing of the RF input signal and the local oscillator input signals produces an IF output signal that includes a sum component and a difference component. The sum component has a frequency that is a sum of a frequency of the RF input signal and a frequency of the local oscillator input signal. The difference component has a frequency that is a difference between the RF input signal frequency and the local oscillator input signal frequency.

An RF mixer may be referred to as a downconverter if the RF mixer is part of a receiver or as an upconverter if the RF mixer is part of a transmitter. When the desired frequency is less than the second input frequency, the process is called downconversion. The RF signal is then the input while the IF signal is the output. When the desired output frequency is greater than the second input frequency, the process is called upconversion. In this case, the IF signal is the input while the RF signal is the output. In a receiver, when the LO frequency is less than the RF frequency, it is called low-side injection and the mixer is a low-side downconverter. When the LO frequency is above the RF frequency, it is called high-side injection, and the mixer is a high-side downconverter.

In RF applications, usually a desired noise match does not coincide with a power match. This means that a receiver design often has to compromise between a noise figure (NF) and an input return loss (S11). While techniques exist for compromising between a noise figure and an input return loss when using a low noise amplifier (LNA), these same techniques cannot be used in mixer-first designs, which do not include an LNA.

SUMMARY

A mixer termination circuit for a downconverter mixer is described. The mixer termination circuit may also include a diplexer circuit coupled to an output of the downconverter mixer. The diplexer filter circuit is configured to separately terminate a sum component present in an output signal of the downconverter mixer and a difference component present in the output signal of the downconverter mixer.

A method of controlling an input impedance of a downconverter mixer includes receiving an output signal from the downconverter mixer at a mixer termination circuit. The method also includes attenuating a sum component of the output signal using a first branch of the mixer termination circuit. The method further includes passing a difference component of the output signal to an output of the mixer termination circuit.

A mixer termination circuit for a downconverter mixer is described. The mixer termination circuit includes means for attenuating a sum component present in an output signal of the downconverter mixer. The circuit also includes means for passing a difference component present in the output of the downconverter mixer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
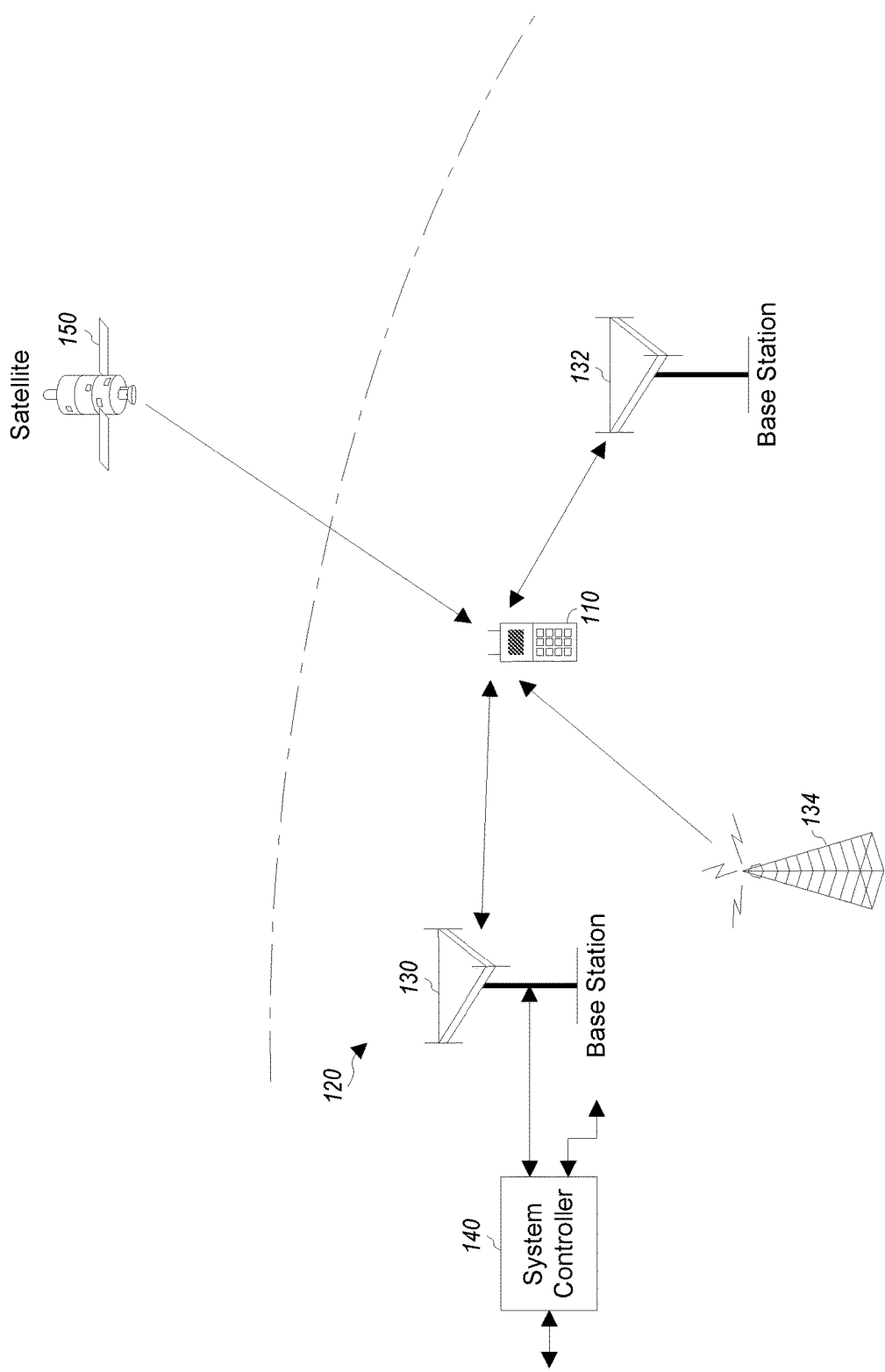
FIG. 1 shows a wireless device communicating with a wireless system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Fabricating mobile radio frequency (RF) chip designs (e.g., mobile RF transceivers) becomes complex at deep sub-micron process nodes due to cost and power consumption considerations. Further design challenges for mobile RF transceivers include analog/RF performance considerations, including mismatch, noise and other performance considerations. The design complexity of these mobile RF transceivers is further complicated by added circuit functions to support communication enhancements.

A wireless device (e.g., a cellular phone or a smartphone) in a wireless communication system may include a mobile RF transceiver to transmit and receive data for two-way communication. The mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

The basic operation of the receiver in a mobile RF transceiver is as follows. For the receiver, a signal from the antenna may be amplified in an RF stage (LNA). The output of the RF stage is provided to a first input of an RF mixer. A local oscillator (LO) signal is provided to a second input of the RF mixer. The RF mixer generates an intermediate frequency (IF) output signal. A second mixer stage may convert the IF output signal to a baseband signal. The baseband signal is then demodulated. The modulation technique is independent from the receiver technology.

During the design of a mobile RF receiver, it is generally recognized that a desired noise match usually does not coincide with a desired power match. As a result, the design of a mobile RF receiver often involves a compromise between a noise figure (NF) and an input return loss (S11). A noise figure may refer to a measure of the degradation of a signal-to-noise ratio (SNR) by components in an RF signal chain. That is, the noise figure represents a measure of the performance of a mobile radio receiver. Generally, the lower a noise figure value, the better the performance of the mobile radio receiver. The signal degradation measured by the noise figure may be substantially affected by a reflection coefficient (or input return loss (S11)). This s-parameter S11 may represent how much power is reflected from an antenna in a hypothetical two port receiver. In practice, a good input return loss (S11) is desirable for avoiding the effects of standing waves, which may be significant when there is (electrically) a significant distance between an antenna/RF filter and a receiver input.

A low noise amplifier (LNA) is an important building block in the front end of a mobile RF transceiver. That is, the LNA determines the noise figure and input voltage standing-wave ratio (VSWR) of the overall system because the LNA is the first component to meet a first block signal fed from an antenna. As a result, improving the noise figure and input standing waves of the overall system involves an LNA having a low noise figure, a high gain, and a low-input standing wave.

Solutions exist for making the input impedance of an LNA look closer to a fifty ohm (50Ω) real value by gyrating an inductance in a source/emitter lead. While these techniques exist for compromising between a noise figure and an input return loss (S11), these same techniques cannot be used in mixer-first designs, which do not include an LNA. For example, in a mixer-first design it may be desirable to exploit the frequency translation of the intermediate frequency (IF) termination to RF (i.e., a capacitive low pass termination creates a band-pass filter at RF), which compromises the ability to control the RF input port reflection coefficient S11.

Aspects of the present disclosure include control over the input return loss (S11) that is independent from the IF signal termination. According to aspects of the present disclosure, input return loss (S11) (or RF input impedance) may be controlled by manipulating the sum component of an IF output signal of a mixer-first mobile RF receiver, which is generally ignored. This inventive aspect of the present disclosure does not affect the difference component of the IF output signal, which is processed in the RF receive chain.

FIG. 1 shows a wireless device 110, including the mixer termination circuit, communicating with a wireless communication system 120. The wireless communication system 120 may be a 5G system, a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless communication system 120 including two base stations 130 and 132 and one system controller 140. In general, a wireless system may include any number of base stations and any number of network entities.

A wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to 5 carriers in one or two bands in LTE Release 11.

Figure 2:
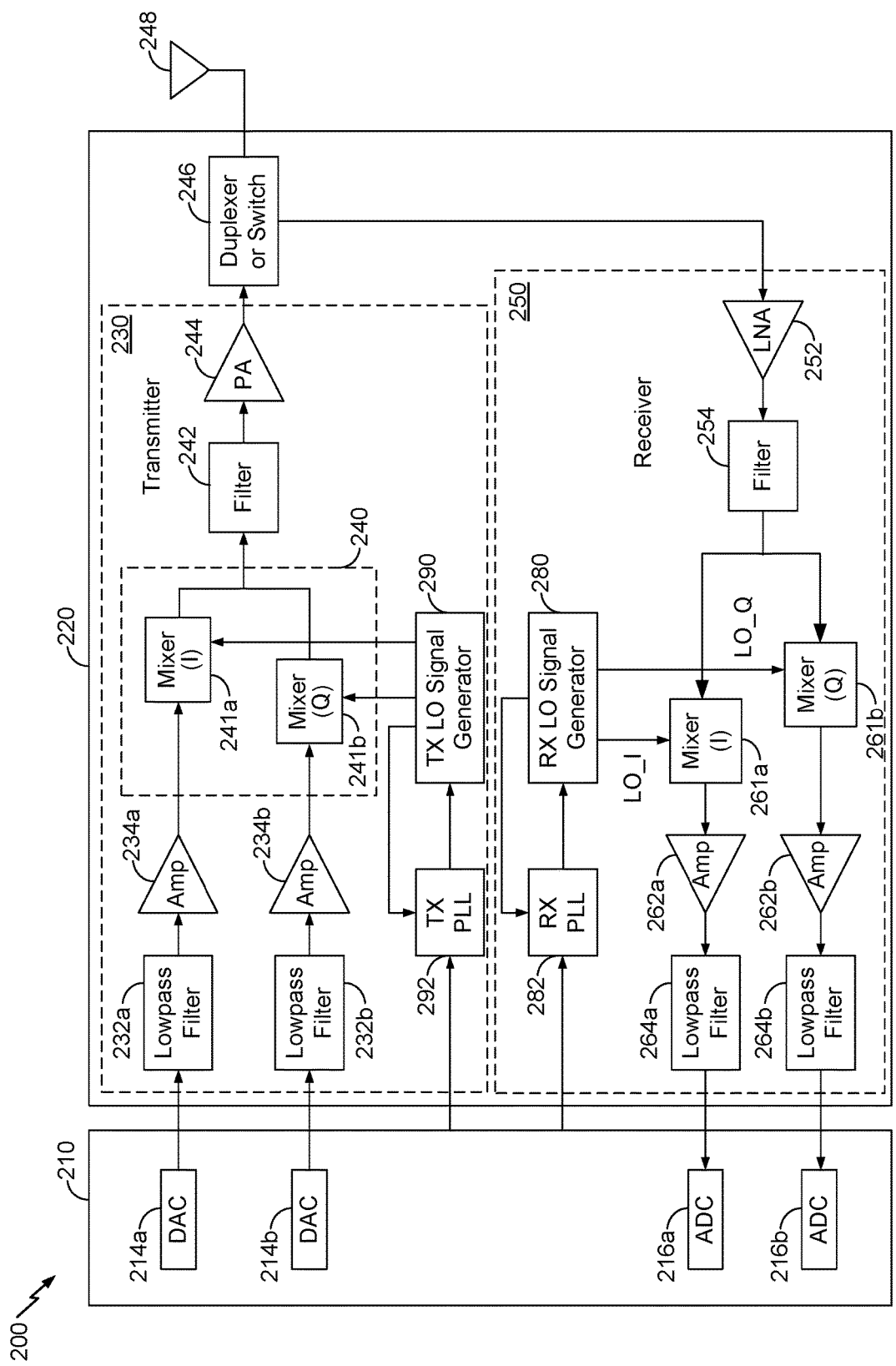
FIG. 2 shows a block diagram of the wireless device shown in FIG. 1.

FIG. 2 shows a block diagram of an exemplary design of a wireless device 200, such as the wireless device 110 shown in FIG. 1. FIG. 2 shows an example of a transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, the wireless device 200 generally includes the transceiver 220 and a data processor 210. The data processor 210 may include a memory (not shown) to store data and program codes, and may generally include analog and digital processing elements. The transceiver 220 may include the transmitter 230 and receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and then from intermediate frequency to baseband in another stage for a receiver. In the direct-conversion architecture, a signal is frequency converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog-converters (DACs) 214a and 214b for converting digital signals generated by the data processor 210 into the in-phase (I) and quadrature (Q) analog output signals (e.g., I and Q output currents) for further processing.

Within the transmitter 230, lowpass filters 232a and 232b filter the in-phase (I) and quadrature (Q) analog transmit signals, respectively, to remove undesired images caused by the prior digital-to-analog conversion. Amplifiers (Amp) 234a and 234b amplify the signals from lowpass filters 232a and 232b, respectively, and provide in-phase (I) and quadrature (Q) baseband signals. Upconverters 240 include an in-phase upconverter 241a and a quadrature upconverter 241b that upconverter the in-phase (I) and quadrature (Q) baseband signals with in-phase (I) and quadrature (Q) transmit (TX) local oscillator (LO) signals from a TX LO signal generator 290 to provide upconverted signals. A filter 242 filters the upconverted signals to reduce undesired images caused by the frequency upconversion as well as interference in a receive frequency band. A power amplifier (PA) 244 amplifies the signal from filter 242 to obtain the desired output power level and provides a transmit radio frequency signal. The transmit radio frequency signal is routed through a duplexer/switch 246 and transmitted via an antenna 248.

In a receive path, the antenna 248 receives communication signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Downconversion mixers 261a and 261b mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262a and 262b and further filtered by lowpass filters 264a and 264b to obtain in-phase (I) and quadrature (Q) analog input signals, which are provided to the data processor 210. In the exemplary configuration shown, the data processor 210 includes analog-to-digital-converters (ADCs) 216a and 216b for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

Figure 3:
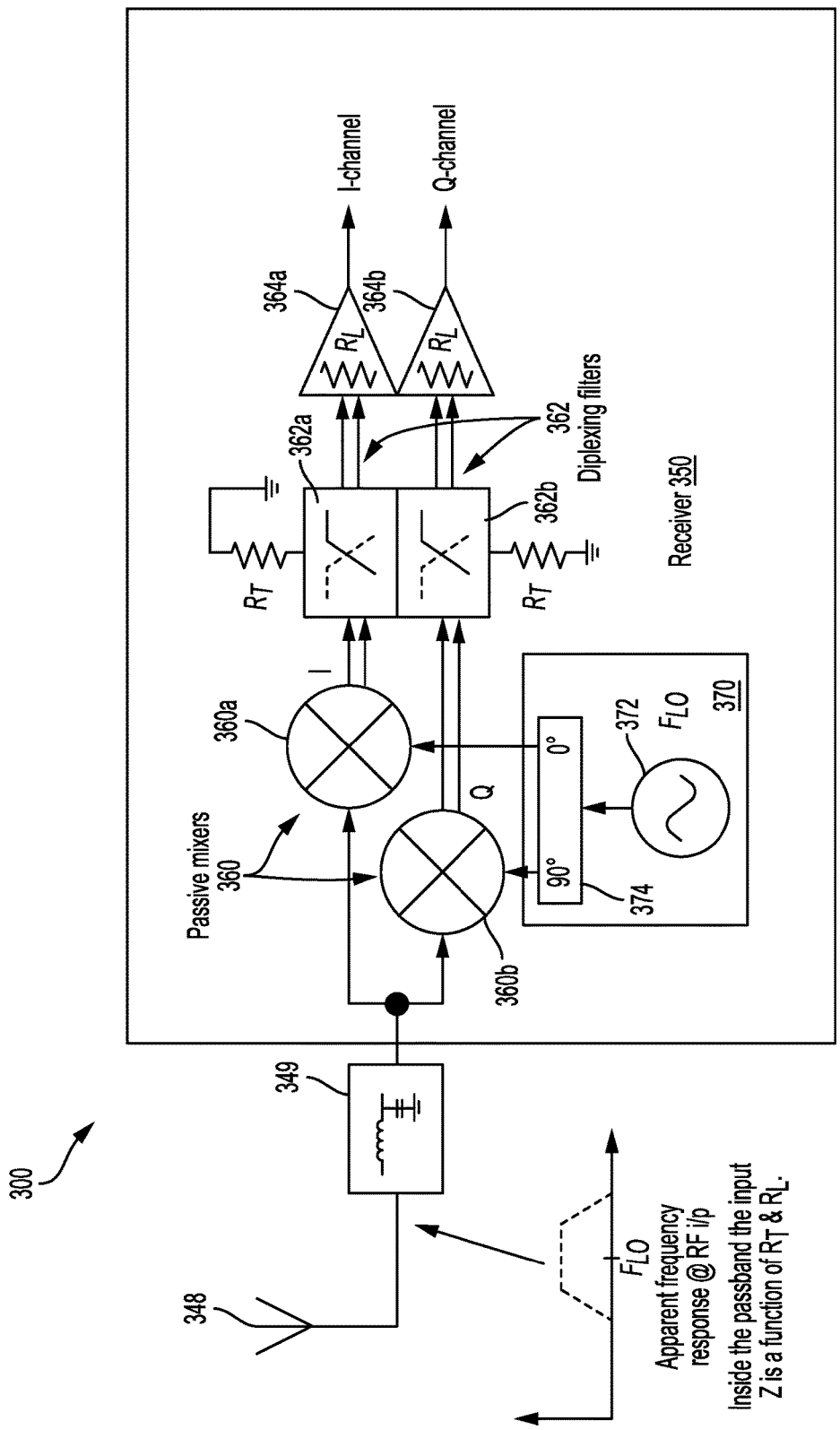
FIG. 3 shows a block diagram of a wireless receiver in a mixer-first configuration, according to an aspect of the present disclosure.

FIG. 3 is a schematic diagram illustrating an RF system 300 including a receiver 350, according to aspects of the present disclosure, as an alternative to the design shown in FIG. 2. The receiver 350 is configured with a mixer-first design, in which a receiver communication path includes mixers (e.g., 360) before amplifiers (e.g., 364). The RF system 300 includes an antenna 348 that feeds an RF input signal to an optional passive block 349 (e.g., a low pass filter). The RF input signal is separated into in-phase (I) and quadrature (Q) analog output components (e.g., I and Q output currents) by passive mixers 360 (e.g., 360a and 360b) of the receiver 350.

In operation, analog output components from the optional passive block are fed to first inputs of the passive mixers 360. In this example, an in-phase local oscillator (LO) signal is fed to a second input of an in-phase passive mixer 360a from a receiver LO signal generator 370, including a local oscillator 372 and a quadrature control 374. In addition, a quadrature local oscillator (LO) signal is fed to a second input of a quadrature mixer 360b from the receiver LO signal generator 370. In this configuration, the passive mixers 360 are shown in a mixer-first configuration, including the in-phase passive mixer 360a and the quadrature mixer 360b. The in-phase passive mixer 360a and the quadrature mixer 360b are three port electronic circuits that convert a signal from one frequency to another.

In operation, the passive mixers 360 take RF input signals and mix the RF input signals with the local oscillator inputs to produce output signals (e.g., intermediate frequency (IF) output signals or baseband output signals when an intermediate frequency is not used). The output signals generally include a sum component and a difference component. The sum component is a sum of the RF input signal and the local oscillator signal. The difference component is a difference between the RF input signal and the local oscillator signal. For example, the sum component has a center frequency at a frequency that is a sum of the center frequency of the RF input signal and the center frequency of the local oscillator signal. The difference component has a center frequency at a frequency that is a difference between the center frequency of the RF input signal and the center frequency of the local oscillator signal.

In the receiver 350, the sum components of the in-phase and quadrature output signals are generally attenuated by diplexing filters 362. Instead, the difference components of the in-phase and quadrature output signals are processed by the diplexing filters 362, including an in-phase diplexer 362a and a quadrature diplexer 362b. The in-phase diplexer 362a and the quadrature diplexer 362b each include a high frequency output port terminated by a resistance $R_T$. In addition, each of the in-phase diplexer 362a and the quadrature diplexer 362b has a low frequency output port coupled to low noise amplifiers (LNAs) 364. In this configuration, an in-phase output signal and a quadrature output signal from the diplexing filters 362 are fed to an in-phase amplifier 364a and a quadrature amplifier 364b of the LNAs 364 to form an I-channel analog signal and a Q-channel analog signal.

Aspects of the present disclosure are directed to providing control over the input return loss S11 of the passive mixers 360 that is independent from the termination of the output of the passive mixers 360. According to aspects of the present disclosure, the input return loss S11 may be controlled by manipulating a sum component of the output signal of the passive mixers 360 in the mixer-first mobile RF receiver configuration shown in FIG. 3. In particular, the input return loss S11 may be controlled by separating the sum component of the output of the passive mixers 360 from the difference component of the output of the passive mixers 360 using the diplexing filters 362, and terminating a port (e.g., a high frequency output port terminated with RT) of the diplexing filters 362 on which the sum component is present to attenuate the sum component. This innovative aspect of the present disclosure has little or no effect on the difference component of the output of the passive mixers 360, which is processed in the RF receive chain.

Figure 4:
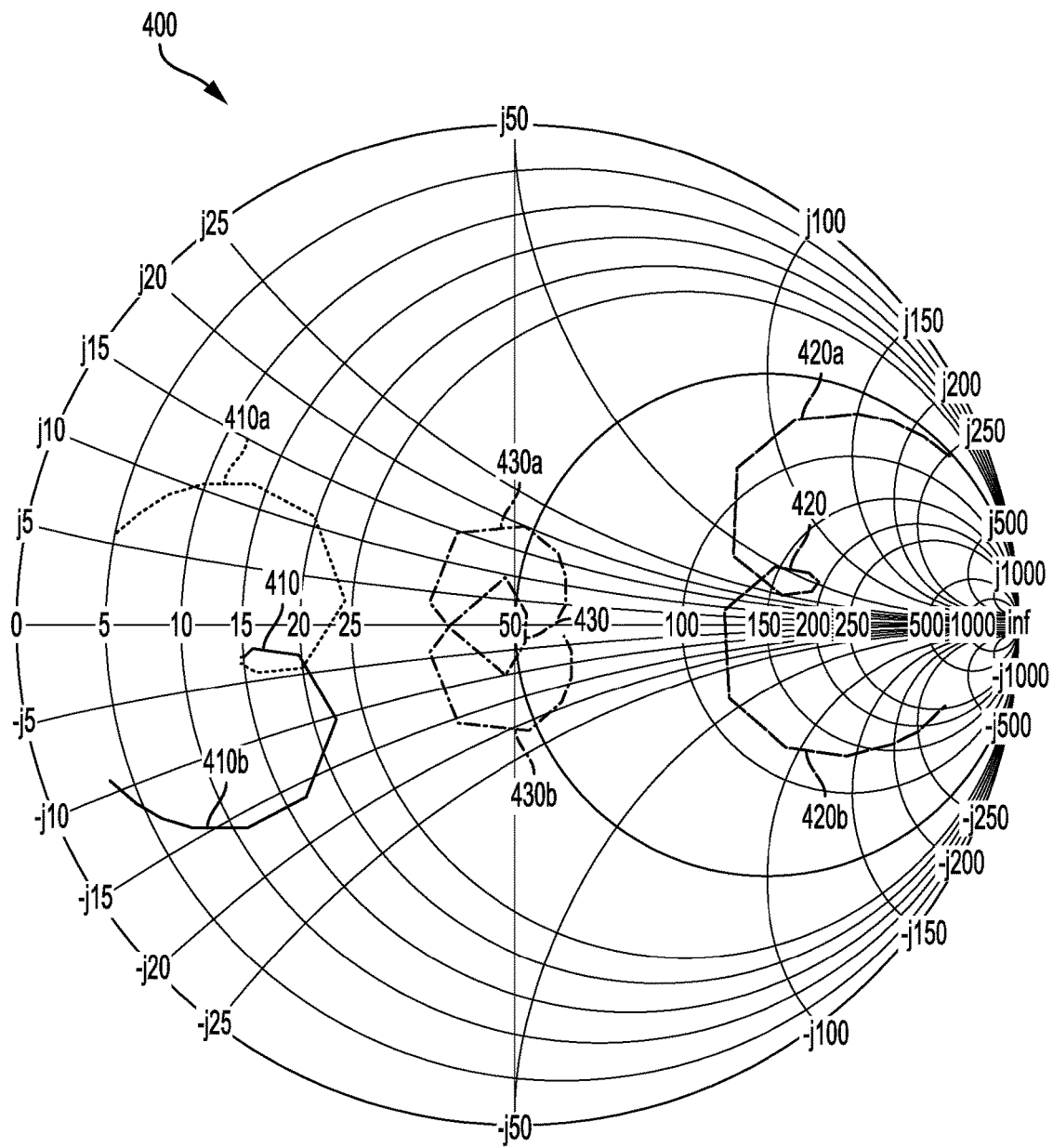
FIG. 4 is a Smith chart illustrating manipulation of a radio frequency (RF) input impedance by manipulating a sum component for selective termination of a mixer-first mobile RF receiver, according to aspects of the present disclosure.
Figure 5:
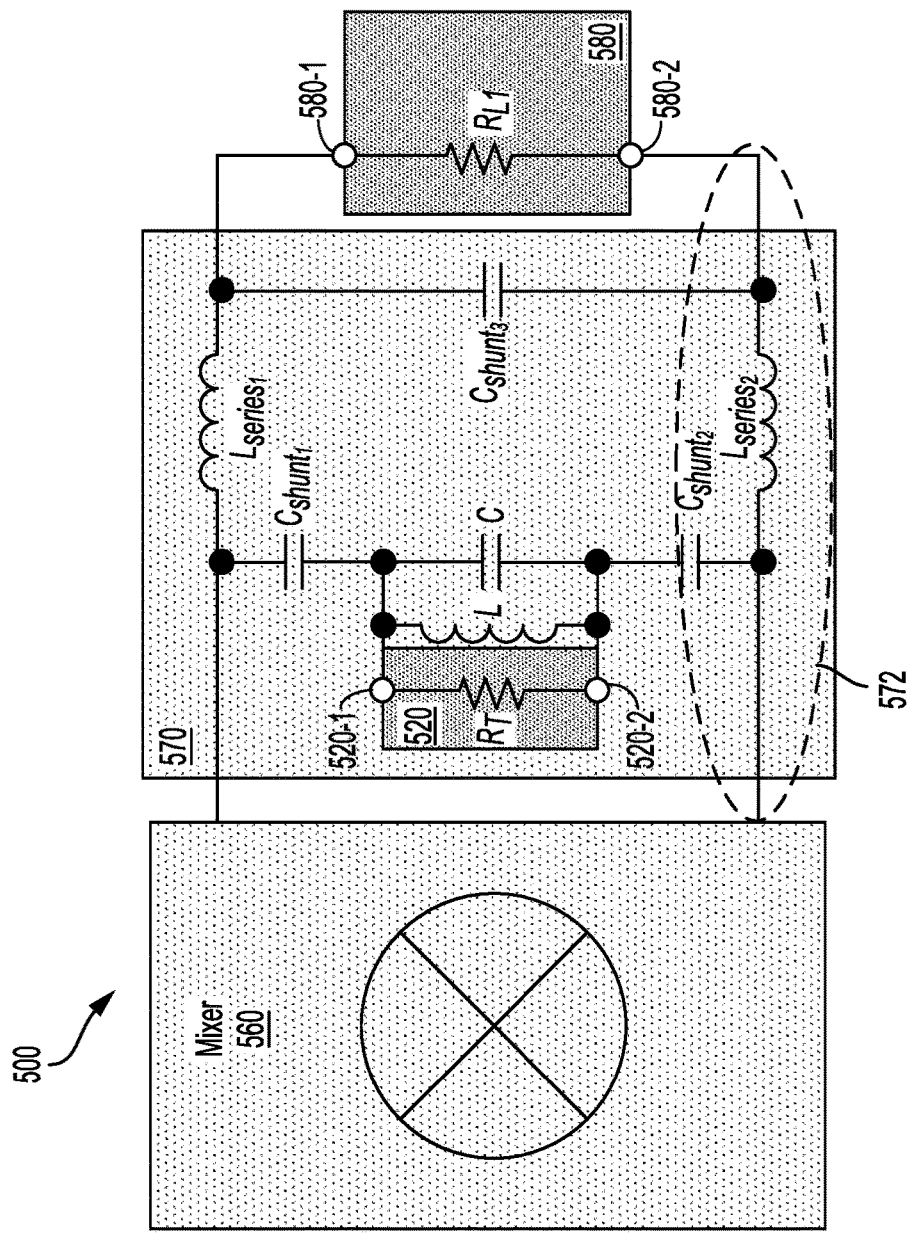
FIG. 5 is a schematic diagram illustrating a radio frequency (RF) integrated circuit (RFIC) system including a receiver in a voltage mode mixer-first design configuration for separately terminating a sum component and a difference component, according to aspects of the present disclosure.
Figure 7:
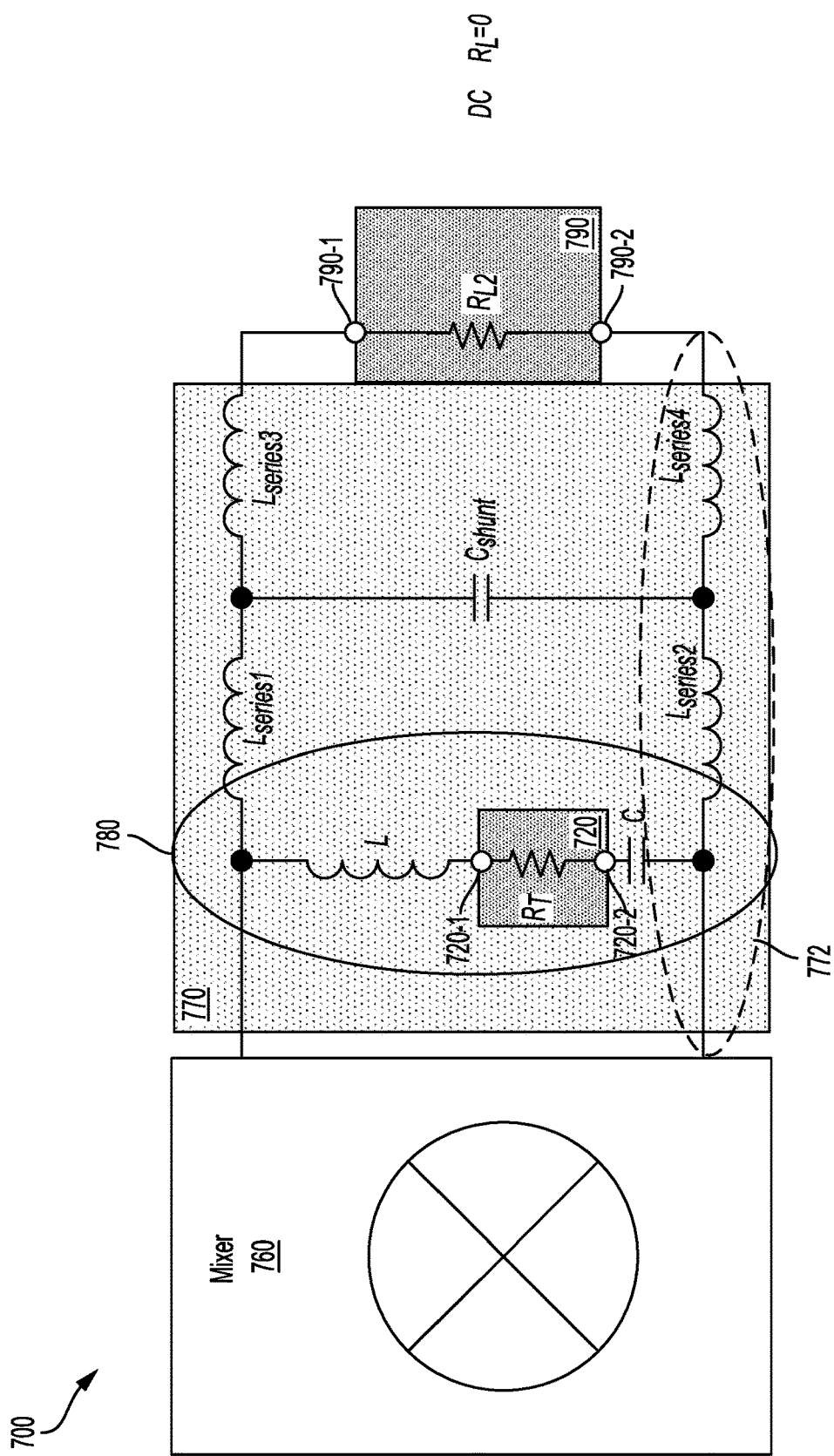
FIG. 7 is a schematic diagram illustrating a radio frequency (RF) integrated circuit (RFIC) system including a receiver in a current mode mixer-first design configuration for separately terminating a sum component and a difference component, according to aspects of the present disclosure.
Figure 8:
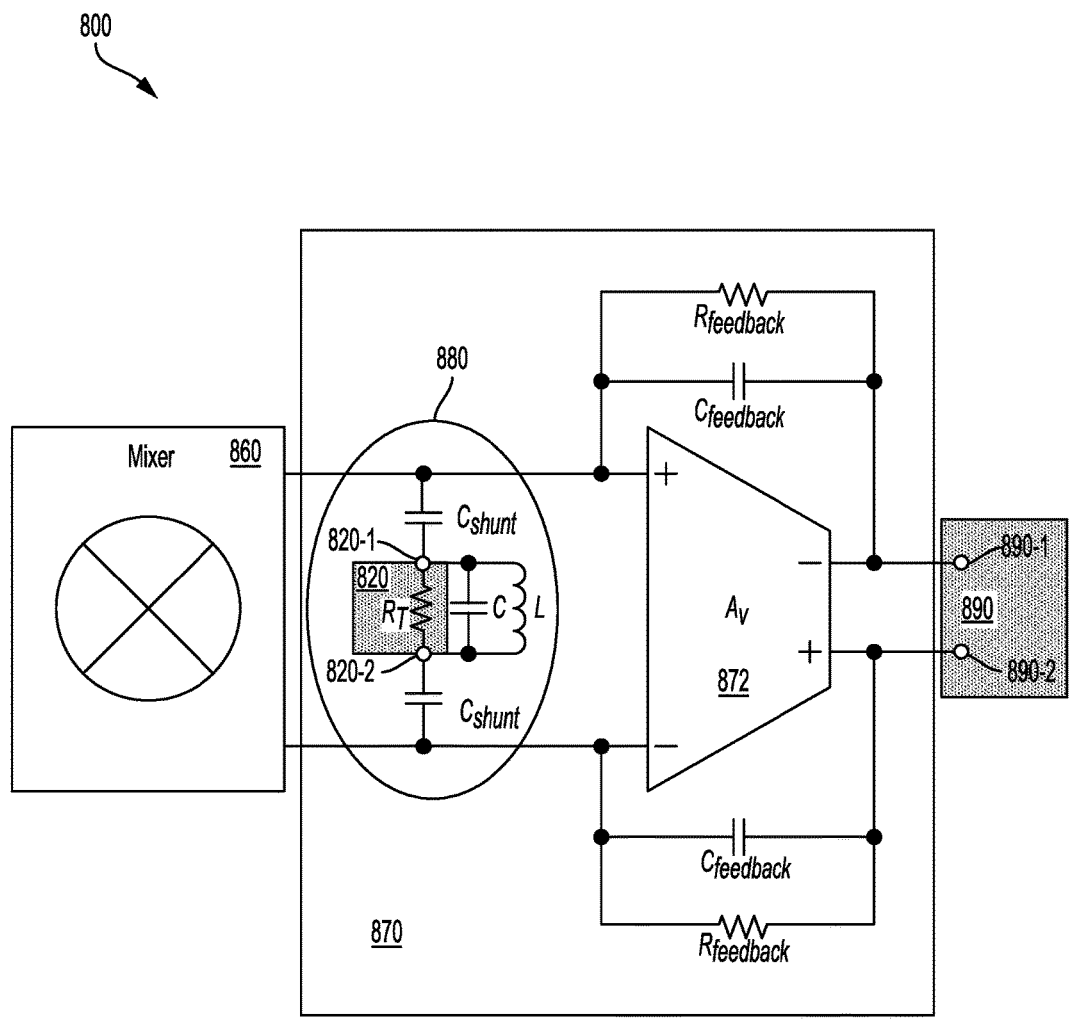
FIG. 8 is a schematic diagram illustrating a radio frequency (RF) integrated circuit (RFIC) system including a receiver in a voltage mode mixer-first design configuration for separately terminating a sum component and a difference component, according to aspects of the present disclosure.
Figure 9:
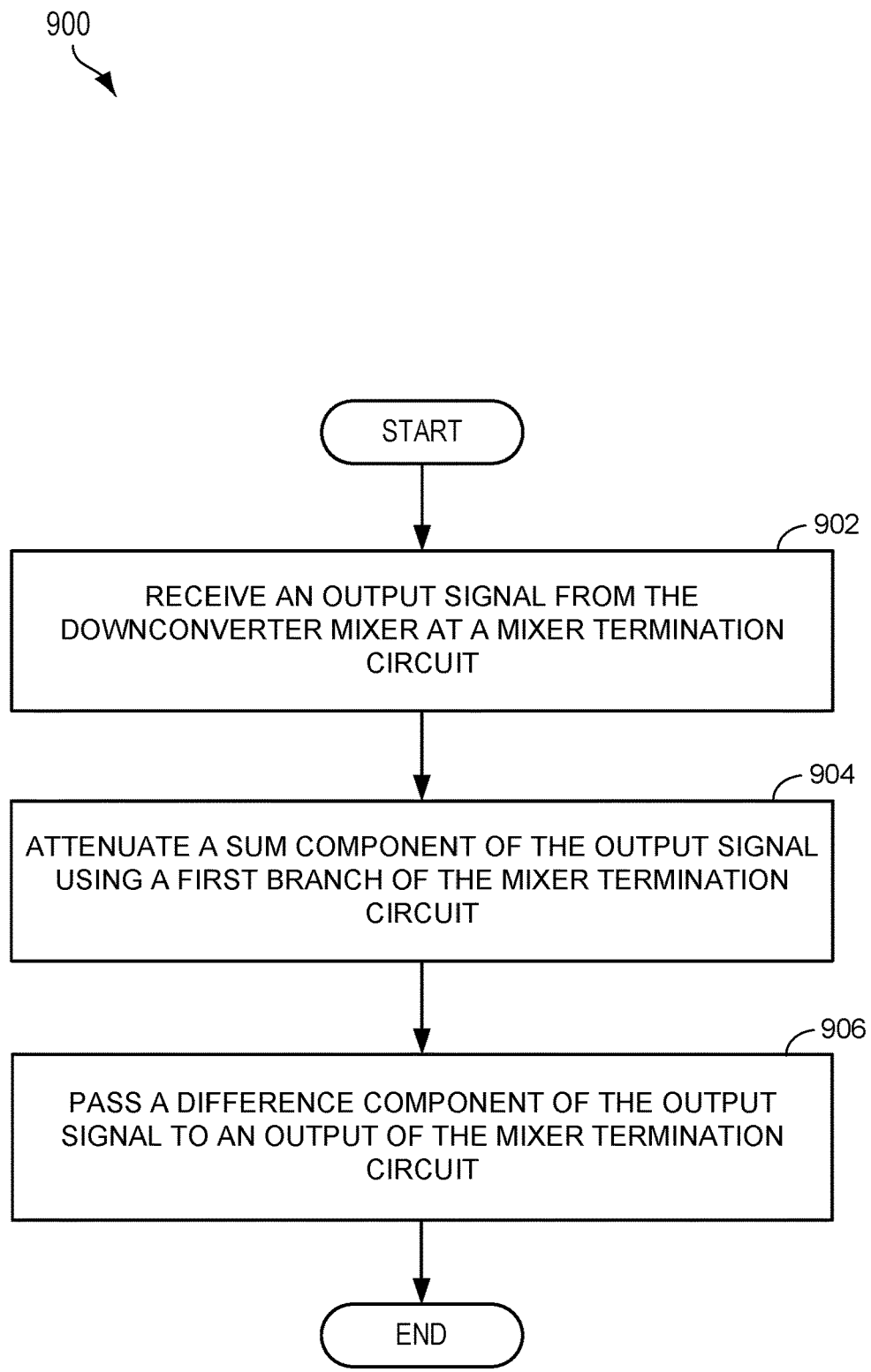
FIG. 9 is a flow diagram illustrating a method for manipulating an intermediate frequency termination impedance of a downconverter mixer in a mixer-first mobile radio frequency (RF) transceiver, in accordance with aspects of the present disclosure.

An RF system having a mixer-first RF receiver that is configured for selective termination by manipulating a sum component is shown in FIGS. 5, 7, and 8. A method of controlling an input return loss S11 of a downconverter mixer is shown in FIG. 9. Control over the input return loss S11 may be achieved by manipulating a termination impedance of an unwanted mixer component, for example, as shown in FIG. 4.

FIG. 4 is a Smith chart 400 illustrating variation of an input return loss S11 by manipulating a sum component for selective termination of a mixer-first RF receiver according to aspects of the present disclosure. The Smith chart 400 illustrates an RF input impedance of a passive mixer (e.g., passive mixers 360 of FIG. 3) with a fifty ohm (50 Ω) source impedance that is terminated with fifty ohms at the output of the mixer. In this configuration, the RF input impedance is measured as a broadband fifty ohms (not easily visible, as it is a small dot at the center of the Smith chart 400).

As illustrated in FIG. 4, the input return loss S11 may be controlled, to some degree, by manipulating the unwanted mixing sum component of the passive mixer, which does not affect a difference component of an output of the passive mixer. For example, when the passive mixer is terminated in a pi-network lowpass filter at the output of the mixer, the sum component of the passive mixer is shorted, whereas the difference component is terminated at fifty ohms. As a result, the input return loss S11 exhibits a low impedance value 410 within a low pass filter bandwidth around the local oscillator (LO) frequency of approximately seventeen ohms (17 Ω). This low impedance value 410 includes an upper sideband (USB) component 410a and a lower sideband (LSB) component 410b that are shaped due to the pi-network lowpass filter.

As further illustrated in FIG. 4, the input return loss S11 may be increased by manipulating the unwanted mixing sum component of the passive mixer, without affecting the difference component of an output of the passive mixer. For example, when the passive mixer is terminated in a T-network lowpass filter at the output of the mixer, the sum component of the passive mixer is subject to an open-circuit. As a result, the input return loss S11 exhibits a high impedance value 420 within the low pass filter bandwidth around the local oscillator frequency of approximately one-hundred seventy ohms (170 Ω). This high impedance value 420 also includes an upper sideband (USB) component 420a and a lower sideband (LSB) component 420b. In operation, the difference component generally passes through the T-network lowpass filter. It should be recognized that T and PI networks are just different realizations of the same filter response, but their input impedances in the stopband tend to either a short or an open circuit.

According to one aspect of the present disclosure, the passive mixer is terminated in a diplexer having, for example, a pi-network lowpass filter, in parallel with a T-network high-pass filter. In this configuration, where the passive mixer is terminated using a diplexer having a pi-network lowpass filter in parallel with a T-network high-pass filter, the difference component propagates through the pi-network lowpass filter at a baseband or intermediate frequency, whereas the sum component propagates through the T-network high-pass filter at high frequency. This diplexer enables termination of both the difference component and the sum component of the mixer output at fifty ohms. As a result, the input return loss S11 exhibits a target impedance value 430 of a broadband fifty ohms, albeit with some ripple in this simulation. This target impedance value 430 also includes an upper sideband component 430a and a lower sideband component 430b.

FIG. 5 is a schematic diagram illustrating an RF integrated circuit (RFIC) system including a receiver 500 in a voltage mode mixer-first design (see FIG. 3) configuration for separately terminating a sum component and a difference component, according to aspects of the present disclosure. In this example, the receiver 500 is configured as a zero/low intermediate frequency (IF) receiver, operating at a 2.4 gigahertz (GHz) RF frequency. A local oscillator (LO) frequency of the receiver 500 is also set to 2.4 GHz to achieve a zero intermediate frequency (e.g., a DC frequency) as the difference component (=RF frequency −LO frequency) of the voltage mode mixer 560. In addition, the sum component (=RF frequency +LO frequency) of the voltage mode mixer 560 would be 4.8 GHz. As a result, a large frequency difference exists between the sum and difference components, which simplifies selective termination of the sum component.

The receiver 500 includes the voltage mode mixer 560 in a differential configuration. The voltage mode mixer 560 is coupled to a diplexer filter circuit 570, configured to separately terminate the sum component and the difference component of the voltage mode mixer 560, according to aspects of the present disclosure. The diplexer filter circuit 570 may be configured in a pi-network composed of a first shunt capacitor $C_{shunt1}$, a first series inductor $L_{series1}$, a second shunt capacitor $C_{shunt2}$, and a second series inductor $L_{series2}$. A third shunt capacitor $C_{shunt3}$ is coupled in parallel with a resistance $R_{L1}$.

The diplexer filter circuit 570 also includes a termination resistor $R_T$ in parallel with an inductor L and a capacitor C. At high frequency (e.g., at the resonance frequency of the inductor L and the capacitor C), the termination resistance $R_T$ terminates the sum mixer component with $R_T$ ohms at a sum component output 520 (520-1 and 520-2), as the shunt capacitors (e.g., $C_{shunt1}$, $C_{shunt2}$, $C_{shunt3}$) are the equivalent of a short at high frequency. By contrast, at a baseband frequency or intermediate frequency, a resistance $R_{L1}$, terminates the difference component with $R_{L1}$ ohms at a difference component output 580 (580-1, 580-2). Although shown in differential configuration, it should be recognized that a branch 572 including the second shunt capacitor $C_{shunt2}$ and the second series inductor $L_{series2}$ would be replaced with a ground connection for a single ended configuration.

Figure 6:
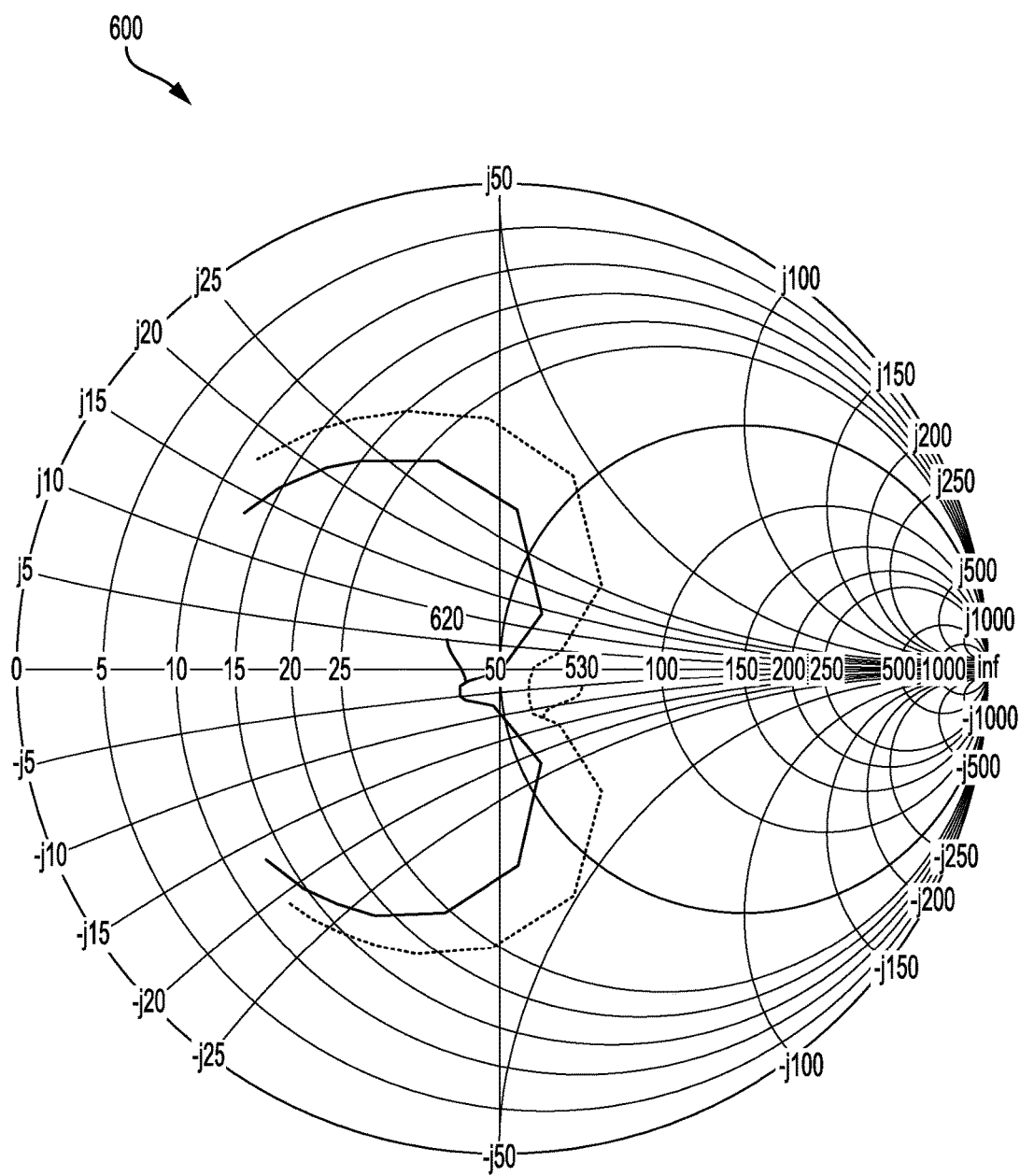
FIG. 6 is a Smith chart illustrating variation of a radio frequency (RF) input impedance by manipulating a sum component for selective termination of the voltage mode mixer of the receiver of FIG. 5, according to aspects of the present disclosure.

FIG. 6 is a Smith chart 600 illustrating variation of the input return loss S11 by manipulating the sum component for selective termination of the voltage mode mixer 560 of the receiver 500 of FIG. 5, according to aspects of the present disclosure. In this example, when the termination resistor $R_T$ is set to 50 ohms, the RF input impedance exhibits a target impedance value 620. When the termination resistor $R_T$ is set to one-hundred ohms, an increased impedance value 530 is achieved. The Smith chart 600 illustrates that the RF input impedance may be controlled within the passband by varying a value of the termination resistor $R_T$. When the termination resistance $R_T$ is set to zero ($R_T$=0), an impedance value of approximately seventeen ohms (17 Ω) is achieved in the passband.

FIG. 7 is a schematic diagram illustrating a radio frequency (RF) integrated circuit (RFIC) system including a receiver 700 in a current mode mixer-first design configuration for separately terminating a sum component and a difference component, according to aspects of the present disclosure. In this example, the receiver 700 is configured as a zero/low IF receiver, operating at 2.4 GHz RF frequency. An LO frequency of the receiver 700 is set to 2.4 GHz to achieve a DC (e.g., zero IF) frequency as the difference component of a current mode mixer 760. In addition, the sum component of the current mode mixer 760 is 4.8 GHz. As a result, a large difference exists between the sum and difference components, which simplifies selective termination of the sum component.

In this configuration, the receiver 700 includes the current mode mixer 760 in a differential configuration. The current mode mixer 760 is coupled to a diplexer filter circuit 770, configured to selectively terminate the sum component and the difference component of the current mode mixer 760, according to aspects of the present disclosure. The diplexer filter circuit 770 may be configured in a T-network composed of a series resistor inductor capacitor (RLC) branch 780 coupled to series inductors (e.g., $L_{series1}$, $L_{series2}$, $L_{series3}$, and $L_{series4}$) and a shunt capacitor $C_{shunt}$. The series RLC branch 780 includes a termination resistor $R_T$ in series with an inductor L and a capacitor C. At high frequency (e.g., a resonance frequency of the inductor L and the capacitor C), the termination resistance $R_T$ terminates the sum component in $R_T$ ohms at a sum component output 720 (720-1 and 720-2) of the diplexer filter circuit 770. That is, the sum component is attenuated by the termination resistance $R_T$ coupled to the sum component output 720 of the current mode mixer 760.

That is, the series inductor L and the capacitor C of the series RLC branch 780 encourage current flow of the sum component through the termination resistor $R_T$ at a resonance frequency of the series inductor L and the capacitor C (e.g., 4.8 GHz). By contrast, current flow to a load resistor $R_{L2}$ is discouraged for signals having a high frequency (e.g., the sum component) at stop-band (e.g., a low frequency port or a high frequency port) of the diplexer filter circuit 770, such that the load is a short-circuit when operating in current mode. By contrast, at a baseband frequency or intermediate frequency, a resistance $R_{L2}$, terminates the difference component with $R_{L2}$ ohms at a difference component output 790 (790-1, 790-2).

To operate in current rather than voltage mode, the diplexer filter circuit 770 senses current rather than voltage. A short-circuit termination that develops no signal voltage across it and is able to sense current is desirable for the diplexer filter circuit 770. An example would be the virtual earth of an op-amp. For direct current (DC), the load resistor $R_{L2}$ 790 is reduced to 0 Ohms. In practice the value of the load resistor $R_{L2}$ is a non-zero (e.g., greater than zero) value. Although shown in differential configuration, it should be recognized that a branch 772 including a second series inductor $L_{series2}$ and the fourth series inductor $L_{series4}$ would be replaced with a ground connection for a single ended configuration.

FIG. 8 is a schematic diagram illustrating a radio frequency (RF) integrated circuit (RFIC) system including a receiver 800 in a voltage mode mixer-first design configuration for separately terminating a sum component and a difference component, according to aspects of the present disclosure. Representatively, the receiver 800 includes a voltage mode mixer 860 in a differential configuration. The voltage mode mixer 860 is coupled to a diplexer filter circuit 870, configured to separately terminate the sum component and the difference component of the voltage mode mixer 860, according to aspects of the present disclosure.

The diplexer filter circuit 870 provides an alternative configuration for low frequency resistance-capacitance (RC) filtering to avoid the use of large inductors. A termination branch 880 of the diplexer filter circuit 870 is similar to the configuration shown in FIG. 5. That is, the diplexer filter circuit 870 also includes a termination resistor $R_T$ in parallel with an inductor L and a capacitor C. At high frequency (e.g., a resonance frequency of the inductor L and the capacitor C), the termination resistance $R_T$ terminates the sum component with $R_T$ ohms at a sum component output 820 (820-1 and 820-2), as the shunt capacitors $C_{shunt}$ are the equivalent of a short at high frequency. By contrast, at a baseband frequency, an RC filter provided by feedback resistors $R_{feedback}$, input capacitors $C_{shunt}$ and feedback capacitors $C_{feedback}$, coupled between an input and an output of a feedback voltage amplifier 872 terminates the difference component with a predetermined resistance at a difference component output 890 (890-1 and 890-2).

In this configuration, the load resistor $R_L$ (see FIG. 5) is realized with the feedback resistors $R_{feedback}$ and a gain Av of the feedback voltage amplifier 872. Here, the Miller effect is exploited to reduce the feedback impedance by $(1+A_V)$. This makes the feedback resistor's Johnson noise appear smaller at the input of the feedback voltage amplifier 872, and provides greater freedom in the choice of feedback capacitors $C_{feedback}$. In addition, capacitance of the feedback capacitors $C_{feedback}$ is split between feedback and input so that high frequency filtering is possible when the feedback voltage amplifier 872 runs out of bandwidth. It is also possible to remove the inductor capacitor (LC) trap within the termination branch 880 if an input resistance of the feedback voltage amplifier 872 is much smaller than the termination resistance $R_T$.

FIG. 9 is a flow diagram illustrating a method 900 for manipulating an intermediate frequency termination impedance of a downconverter mixer in a mixer-first mobile RF transceiver, in accordance with aspects of the present disclosure. The blocks in the method 900 can be performed in or out of the order shown, and in some aspects, can be performed at least in part in parallel.

At block 902, an output signal is received from the downconverter mixer at a mixer termination circuit. The output signal is composed of a sum component and a difference component. At block 904, the sum component of the output signal is attenuated using a first branch of the mixer termination circuit. At block 906, the difference component of the output signal is passed to an output of the mixer termination circuit. For example, as shown in FIG. 5, separate termination of a sum component and a difference component is shown for the voltage mode mixer 560 using the diplexer filter circuit 570. Termination control for a current mode mixer is shown in FIG. 7. For example, the method 900 may further include directing a high frequency path through the series RLC branch 780 of the diplexer filter circuit 770 including the termination resistor at the resonance frequency of an inductor and a capacitor of the series RLC branch 780, as shown in FIG. 7.

Aspects of the present disclosure include a mixer termination circuit for a downconverter mixer. This aspect of the disclosure may include a mixer-first downconverter. The mixer termination circuit includes a diplexer coupled to an output of the downconverter mixer. In this configuration, the diplexer is operable to separately terminate a sum component and a difference component of an output signal from the downconverter mixer. A termination resistor may be coupled between a sum component output and a difference component output of the mixer termination circuit. The termination resistor may be coupled in series or in parallel with an inductor and a capacitor. In addition, a feedback voltage amplifier may be coupled to the sum component output and the difference component output of the mixer termination circuit.

According to a further aspect of the present disclosure, a mixer termination circuit for a downconverter mixer is described. A circuit may include means for attenuating a sum component and means for passing a difference component. The means for attenuating and means for passing may be, for example, a diplexer filter circuit shown in FIGS. 5, 7, and 8. In another aspect, the aforementioned means may be any module, or any apparatus configured to perform the functions recited by the aforementioned means.

Figure 10:
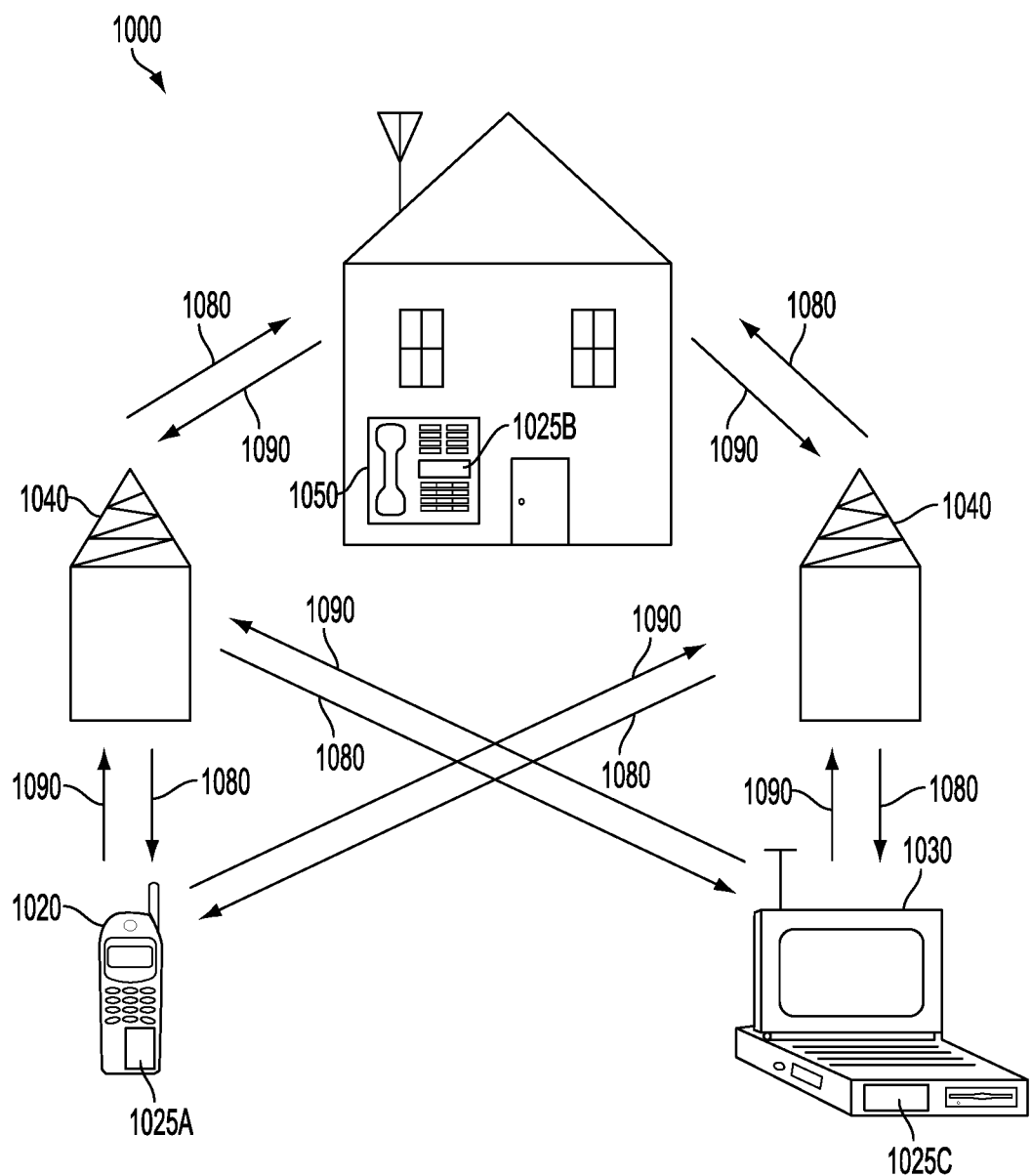
FIG. 10 is a block diagram showing an exemplary wireless communication system in which an aspect of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B that include the disclosed mixer termination circuit. It will be recognized that other devices may also include the disclosed mixer termination circuit, such as the base stations, user equipment, and network equipment. FIG. 10 shows forward link signals 1080 from the base station 1040 to the remote units 1020, 1030, and 1050 and reverse link signals 1090 from the remote units 1020, 1030, and 1050 to base station 1040.

In FIG. 10, remote unit 1020 is shown as a mobile telephone, remote unit 1030 is shown as a portable computer, and remote unit 1050 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed mixer termination circuit.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The apparatuses, methods, and systems disclosed herein may also be implemented digitally and differentially, among others. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. For example, the apparatuses, methods, and systems described herein may be performed digitally and differentially, among others. Accordingly, the scope of the present disclosure is intended to be defined only by reference to the appended claims.

What is claimed is:

1. A mixer termination circuit for a downconverter mixer, comprising:
   a diplexer circuit comprising:
      a first node coupled to an output of the downconverter mixer;
      a sum component node of the diplexer circuit configured to separately terminate a sum component present in an output signal of the downconverter mixer;
      a difference component node to separately terminate a difference component present in the output signal of the downconverter mixer;

a termination resistor coupled to the sum component node; and an inductor and a capacitor coupled in series with the termination resistor.

2. The mixer termination circuit of claim 1, in which the diplexer circuit comprises a feedback voltage amplifier.

3. The mixer termination circuit of claim 1, in which the diplexer circuit comprises a T-network, in which the inductor, the capacitor, and another resistor have a series resistor inductor capacitor (RLC) circuit branch including the termination resistor.

4. The mixer termination circuit of claim 3, in which the RLC circuit branch is tuned to a frequency of the sum component.

5. The mixer termination circuit of claim 1, in which the diplexer circuit comprises an RC filter, including a load resistor $R_L$ in parallel with a shunt capacitor, configured to terminate a difference component output of the downconverter mixer at a baseband frequency.

6. The mixer termination circuit of claim 1, in which the sum component present in the output signal has a frequency that is a sum of a frequency of a local oscillator (LO) signal of the downconverter mixer and a frequency of a radio frequency (RF) input signal provided to the downconverter mixer.

7. The mixer termination circuit of claim 1, in which the difference component present in the output signal has a frequency that is a difference of a frequency of a radio frequency (RF) input signal provided to the downconverter mixer and a frequency of a local oscillator (LO) signal of the downconverter mixer.

8. The mixer termination circuit of claim 1, in which the downconverter mixer comprises a mixer-first downconverter, in which a mixer and an amplifier are in a receive chain and an output of the mixer is fed to the amplifier.

9. The mixer termination circuit of claim 1, in which the downconverter mixer comprises a current mode mixer or a voltage mode mixer.

10. The mixer termination circuit of claim 1, integrated into a mobile RF receiver.

11. The mixer termination circuit of claim 10, in which the mobile RF receiver is integrated into an RF integrated circuit (RFIC) system.

12. A mixer termination circuit for a downconverter mixer, comprising:

a diplexer circuit comprising:

a first node coupled to an output of the downconverter mixer;

a sum component node of the diplexer circuit configured to separately terminate a sum component present in an output signal of the downconverter mixer;

a difference component node to separately terminate a difference component present in the output signal of the downconverter mixer;

a termination resistor coupled to the sum component node; and an inductor and a capacitor coupled in parallel with the termination resistor.

13. The mixer termination circuit of claim 12, in which the diplexer circuit comprises a pi-network, in which the inductor and the capacitor are in parallel with a termination resistor, configured to terminate a sum component output of the downconverter mixer at a resonance frequency of the inductor and the capacitor.

14. The mixer termination circuit of claim 13, in which the inductor, the capacitor, and the termination resistor are tuned to a frequency of the sum component present in the output signal of the downconverter mixer.

* * * * *